United States Patent
Poon et al.

(10) Patent No.: US 7,112,499 B2
(45) Date of Patent: Sep. 26, 2006

(54) DUAL STEP SOURCE/DRAIN EXTENSION JUNCTION ANNEAL TO REDUCE THE JUNCTION DEPTH: MULTIPLE-PULSE LOW ENERGY LASER ANNEAL COUPLED WITH RAPID THERMAL ANNEAL

(75) Inventors: Chyiu Hyia Poon, Singapore (SG); Leng Seow Tan, Singapore (SG); Byung Jin Cho, Singapore (SG); Alex See, Singapore (SG); Mousumi Bhat, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/759,671

(22) Filed: Jan. 16, 2004

(65) Prior Publication Data

US 2005/0158956 A1 Jul. 21, 2005

(51) Int. Cl.
*H01L 21/336* (2006.01)
*H01L 21/31* (2006.01)
*H01L 21/469* (2006.01)

(52) U.S. Cl. ......................... 438/308; 438/372; 438/305
(58) Field of Classification Search ................ 438/305, 438/166, 199, 308, 528, 535, 653, 770, 758, 438/303, 372; 257/E21.285, E21.256, E21.257, 257/E21.335, E21.345
See application file for complete search history.

(56) References Cited

U.S. PATENT DOCUMENTS

| | | | | |
|---|---|---|---|---|
| 5,399,506 | A | 3/1995 | Tsukamoto | 437/19 |
| 5,908,307 | A * | 6/1999 | Talwar et al. | 438/199 |
| 5,937,325 | A | 8/1999 | Ishida | 438/655 |
| 6,100,171 | A | 8/2000 | Ishida | 438/535 |
| 6,335,253 | B1 * | 1/2002 | Chong et al. | 438/305 |
| 6,365,476 | B1 | 4/2002 | Talwar et al. | 438/308 |
| 6,423,586 | B1 * | 7/2002 | Yamazaki et al. | 438/166 |
| 6,878,415 | B1 * | 4/2005 | Downey | 438/770 |

* cited by examiner

*Primary Examiner*—Walter L Lindsay, Jr.

(57) ABSTRACT

A process is described to form a semiconductor device such as MOSFET or CMOS with shallow junctions in the source/drain extension regions. After forming the shallow trench isolations and the gate stack, sidewall dielectric spacers are removed. A pre-amorphizing implant (PAI) is performed with $Ge^+$ or $Si^+$ ions to form a thin PAI layer on the surface of the silicon regions adjacent to the gate stack. $B^+$ ion implantation is then performed to form source/drain extension (SDE) regions. The $B^+$ implant step is then followed by multiple-pulsed 248 nm KrF excimer laser anneal with pulse duration of 23 ns. This step is to reduce the sheet resistance of the junction through the activation of the boron dopant in the SDE junctions. Laser anneal is then followed by rapid thermal anneal (RTA) to repair the residual damage and also to induce out-diffusion of the boron to yield shallower junctions than the just-implanted junctions prior to RTA.

24 Claims, 3 Drawing Sheets

DUAL STEP SOURCE/DRAIN EXTENSION JUNCTION ANNEAL TO REDUCE THE JUNCTION DEPTH: MULTIPLE-PULSE LOW ENERGY LASER ANNEAL COUPLED WITH RAPID THERMAL ANNEAL

BACKGROUND OF THE INVENTION (1) Field of the Invention

The present invention relates generally to a method of forming a semiconductor device, and more particularly to form an MOS transistor with reduced junction depth using a combination of multiple-pulsed laser anneal and rapid thermal anneal.

(2) Description of the Prior Art

Ion implantation process is essential to fabricate modern integrated circuits. Doping or otherwise modifying silicon or other semiconductor wafers relies on this technology, which involves generating the required beam of ions and implanting them into the substrate so that they come to rest just below the semiconductor surface. Most commonly implanted species are: antimony, arsenic, boron, boron difluoride, germanium, and phosphorous. Currently, ion implantation is used to form source and drain regions, shallow extension junctions between the channel and source/drain contacts, and electrically active poly-silicon gate electrodes. Ion implantation is always followed by an annealing step to heal the damage that occurs when ions occupy the interstitial spaces in the semiconductor crystal lattice during implanting.

As MOSFET devices are scaled down below 100 nm, highly doped ultra-shallow junctions are necessary for high current drive capability with acceptable short-channel performance. In order to minimize short-channel effect and maximize device performance at the same time, source/drain (S/D) engineering associated with diffusion profiles of source/drain junction are explored. Analysis shows that the critical parameter for reducing the resistance of the S/D extension junction is the dopant diffusion slope rather than its maximum doping level. In other words, development of advance process technology for achieving a box-shaped profile is a more efficient way to sustain lower junction resistance rather than pursuing higher doping level that may cause problems of junction depth control.

With the conventional junction formation by ion implant and rapid thermal anneal, it is very difficult to obtain highly steep ultra-shallow junction profiles because the interaction between implantation induced point defects and dopant atoms during annealing can considerably broaden the profile shape through the mechanism of transient enhanced diffusion (TED). Laser annealing with pre-amorphization implant (PAI) has received considerable attention as a potential solution to achieve low-resistance, ultra-shallow box-shaped SD extension junctions. However, the method has integration issues related to gate shape distortion due to inherently inhomogeneous annealing process that takes place within a few hundred nanoseconds. In the literature, pulse laser annealing in combination with PAI has been discussed with limited success. Unfortunately, the method has major integration problems because the high-energy fluence used for sufficient dopant activation and defect removal gives rise to melting of the poly-silicon gate. Although low energy implants are needed to reduce junction depths, the lowering of energy implies a trade-off between shallower junctions and higher junction resistivity.

U.S. Pat. No. 5,399,506 describes a process wherein shallow junction with reduced junction leakage is achieved by the combination of ion implantation and low temperature annealing (600° C. for 1 hour) to reduce point defects and pulsed laser (700 mJ/cm$^2$, 44 nsec pulse width) irradiation to activate the implanted ions.

U.S. Pat. No. 5,937,325 describes a process to form low resistance titanium silicide gates by using a laser anneal process in two steps: first laser anneal converts the deposited titanium layer to a high resistivity titanium silicide layer and the second laser anneal (after removing the un-reacted titanium layer) converts the high resistivity silicide layer into low resistivity titanium silicide phase.

U.S. Pat. No. 6,100,171 describes a laser annealing process for removing fluorine from a gate conductor and thereby reduce boron penetration. During anneal, laser energy is such as to melt a portion of the gate conductor facilitating the removal of the fluorine that is incorporated in the gate during $BF^+_2$ implantation. In another embodiment, rapid thermal anneal (RTA) follows laser anneal process for activating the dopants in the S/D regions.

U.S. Pat. No. 6,365,476 B1 describes a laser thermal process wherein after the first implant and anneal to form S/D regions and after the removal of sidewall spacers around the gate structure, a blanket pre-amorphization implant is performed to form S/D amorphized extension regions. After depositing a layer that is opaque to a select laser wavelength, the substrate is then irradiated to selectively melt the amorphized S/D extensions.

SUMMARY OF THE INVENTION

Accordingly, the main object of this invention is to describe a method of forming a semiconductor device with reduced junction depth of the source/drain extension regions.

It is yet another object to form shallow source/drain extension regions using laser anneal followed by rapid thermal anneal.

Another objective of the invention is to describe a dual-step annealing method that uses multiple-pulse low energy laser anneal followed by rapid thermal anneal.

In accordance with these objectives, a process is described to form a MOSFET device with shallow junction in the source/drain extension regions. After forming a MOSFET device up to and including the step of forming the gate structure but before the formation of sidewall dielectric spacers, a pre-amorphizing implant (PAI) is performed with $Si^+$ or $Ge^+$ ions to form a thin PAI layer on the surface of the silicon regions adjacent to the gate. $B^+$ ion implantation is then performed to form source/drain extension regions. The implant step is then followed by multiple pulse 248 nm KrF excimer laser anneal with pulse duration of 23 ns. This step is to reduce the sheet resistance of the junction through the activation of the B dopant. Laser anneal is then followed by rapid thermal anneal (RTA) to repair the residual damage and also to induce out-diffusion on the B to yield shallower junctions than the just-implanted junctions prior to RTA.

BRIEF DESCRIPTION OF THE DRAWINGS

The objects, advantages, and details of fabricating a semiconductor device according to this invention will be more clearly understood from the following detailed description taken in conjunction with the accompanying drawings.

DETAILED DESCRIPTION OF THE INVENTION

Figure 1:
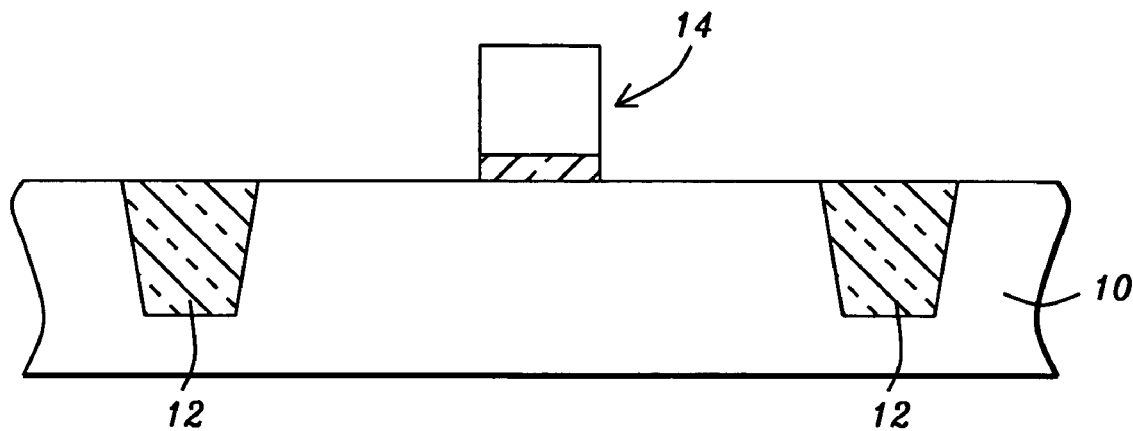
FIG. 1 is a cross-section of a partially formed MOSFET device showing the shallow trench isolation regions and the gate structure without the sidewall spacers.

Using the standard processes from prior art, a field effect transistor device is formed in a silicon semiconductor substrate 10, n type <100> silicon in this embodiment, as shown in FIG. 1 up to and including the steps of forming shallow trench isolations (STI) 12 and the gate electrode structure 14.

Figure 2:
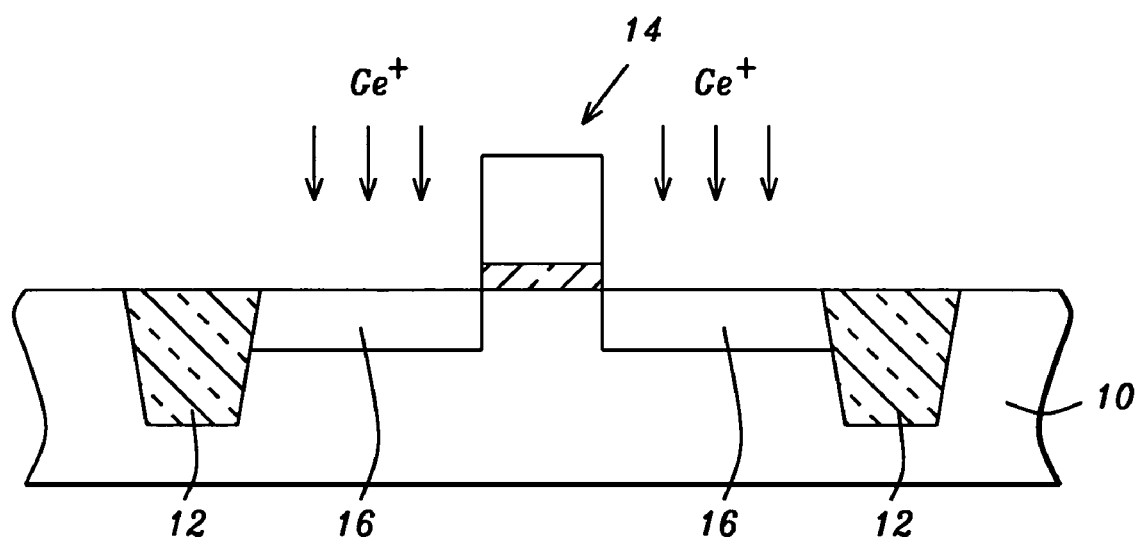
FIG. 2 is a cross-section of the partially formed MOSFET device after pre-amorphizing implant, showing the PAI layer.

A pre-amorphizing $Ge^+$ ion implant known in prior art is performed to form a thin PAI layer 16 in silicon as shown in FIG. 2. The implant conditions are: ion energy of approximately 1 to 20 keV and dose of about 1E14 to 1E16 ion/$cm^2$. The PAI layer thickness is approximately between about 2 and 40 nm. Heavy $Ge^+$ ions cause adequate damage to the crystalline silicon lattice thereby rendering the top surface amorphous. Since the melting point of amorphous silicon layer is approximately 300 C less than that of crystalline silicon, selective annealing process is therefore enabled. It is to be noted the lattice damage during this step is later repaired during subsequent annealing steps.

Figure 3:
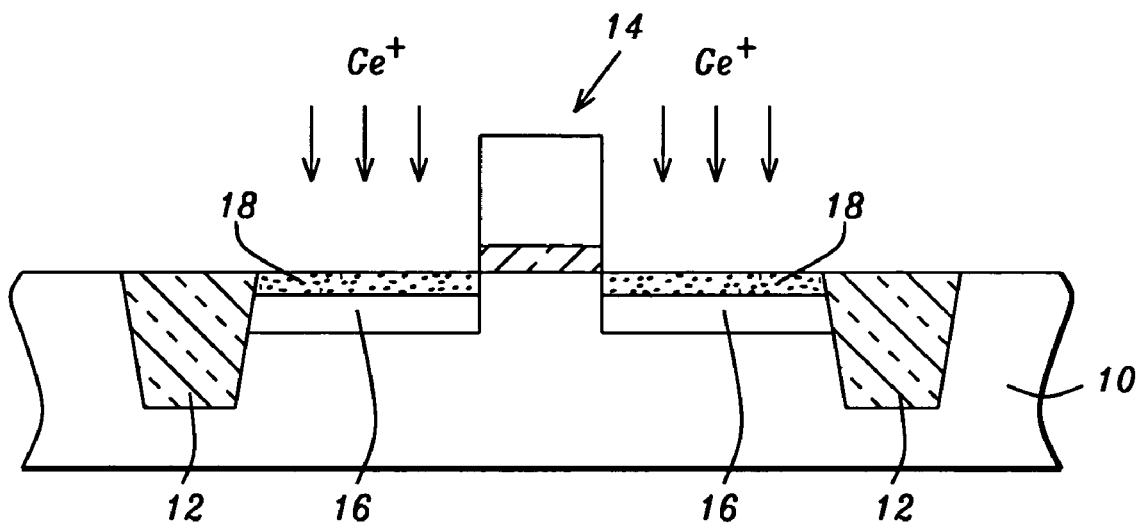
FIG. 3 is a cross-section of a partially formed MOSFET device after ion implantation to form source/drain extension regions.

$B^+$ ion implantation at ion energy of approximately 0.2–0.7 keV and dose of 5E14 to 1E16 ions/$cm^2$ is then performed in the pre-amorphized silicon layer 16, as shown in FIG. 3, to form the source/drain extensions 18.

The substrate is then subjected to sequential dual annealing steps. The first step is a low energy multiple-pulse laser anneal in the sub-melt regime.

Figure 4:
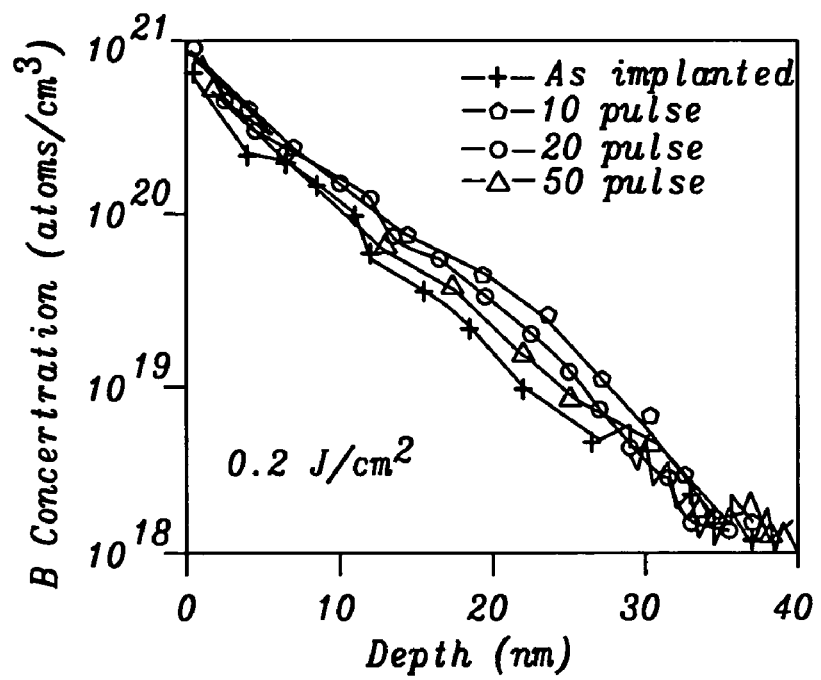
FIG. 4 is a graph showing boron concentration profiles in silicon after laser annealing with increasing number of pulses.

FIG. 4 shows the effect of multiple-pulsed (0–50 pulses) laser anneal at 0.2 J/$cm^2$ on boron concentration profile. It is seen that the junction depth, approximately 40 nm for all cases including as-implanted case, does not increase significantly with an increase in the number of laser pulses from the as-implanted depth, because of low energy of the laser. This is a desirable effect since the implanted dopants can be activated without increasing the junction depth.

Figure 5:
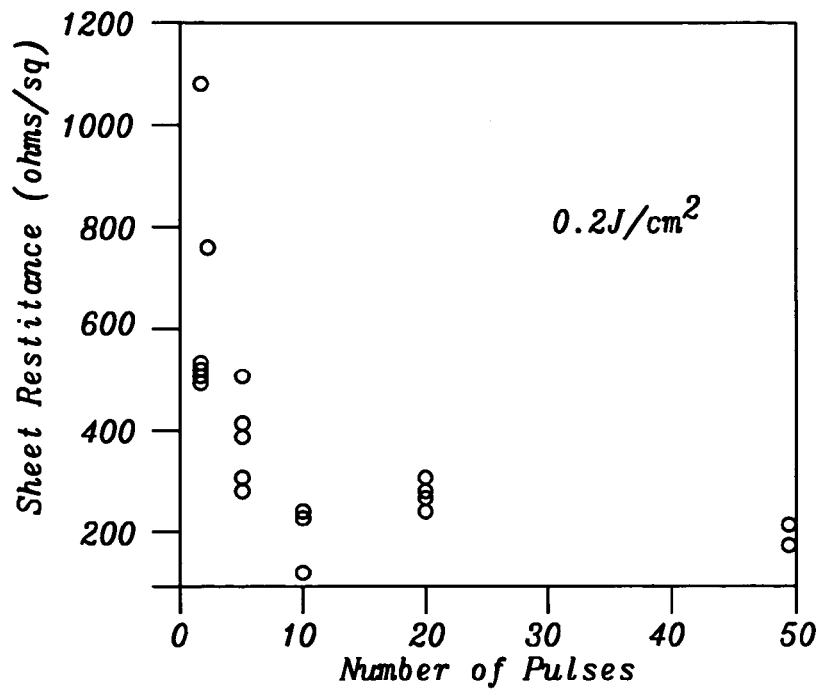
FIG. 5 is a graph showing sheet resistance values as a function of number of laser pulses at constant laser fluence.

FIG. 5 shows the effect of number of pulses in laser annealing at a constant fluence of 0.2 J/$cm^2$ on junction sheet resistance. Although there has been negligible increase in boron diffusion with increased number of pulses from the as-implanted case, as seen in FIG. 4, there is a dramatic decrease in sheet resistance up to approximately 10 pulses, after which the decrease in sheet resistance is negligible.

Figure 6:
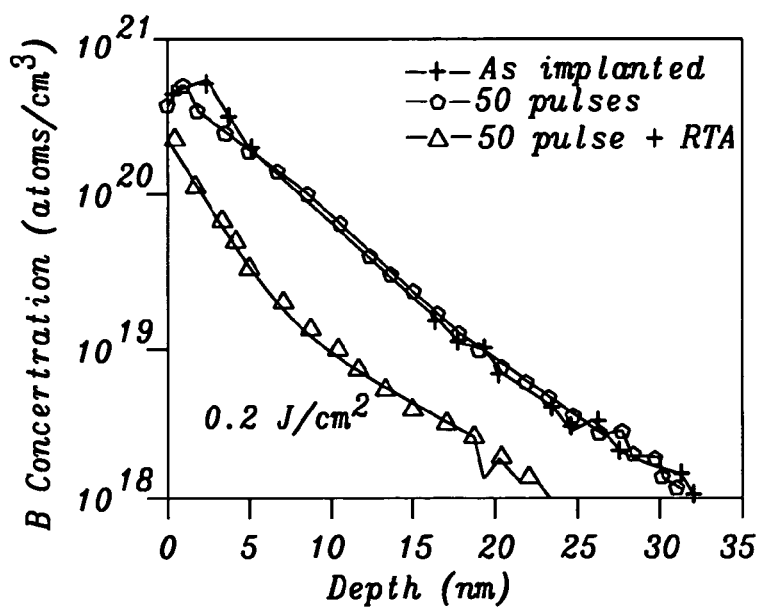
FIG. 6 is a graph showing boron concentration profile in silicon after the dual step anneal: multiple pulse low energy laser anneal+rapid thermal anneal.

FIG. 6 illustrates the effect of dual step anneal on boron concentration profile and junction depth. Three cases are shown: as-implanted, 50 pulse laser anneal only at 0.2 J/$cm^2$ fluence, and 50 pulse laser anneal at 0.2 J/$cm^2$ fluence and subsequent rapid thermal anneal. It is observed that the junction depth in the dual step anneal case has decreased from the as-implanted or the laser anneal only case. The shallower junction is interpreted as due to the out-diffusion of boron.

The advantages of this invention over prior art are:

a) allows the fabrication of a MOSFET device with highly activated, ultra-shallow source/drain extension (SDE) junction for node generations of 65 nm or below;

b) post-implant anneal with low temperature laser with low energy fluence simplifies the process integration issue of laser annealing in the conventional device fabrication process flow;

c) multiple low energy laser pulses facilitate the activation of dopant species to form highly activated SDE junctions without increasing junction depth;

d) rapid thermal anneal step following the laser anneal further repairs the residual lattice damage caused during the pre-amorphitization implant;

e) rapid thermal annealing step following laser annealing induces the out-diffusion of implanted boron thereby yielding a shallower junction than that achievable with as-implanted only process.

While the invention has been particularly shown and described with reference to the general embodiment and a specific application thereof, it will be understood by those skilled in the art that various changes in form and details to the method and applications may be made without departing from the concept, spirit, and the scope of the invention.

What is claimed is:

1. A method of fabricating a MOSFET device with shallow source/drain extension junctions comprising the steps:

forming a pre-amorphized implant layer in between shallow trench isolation regions and adjacent to gate electrode structure on a semiconductor substrate;

performing ion implantation of dopants in said pre-amorphized implant layer to form source/drain extension regions; and performing a sequential dual step anneal of said source/drain extension regions comprising:

a) a first low energy multiple-pulse laser anneal step in the sub-melt regime to activate the dopants in the source/drain extension regions followed by b) a second rapid thermal anneal step to heal residual damage from the ion implantation and to cause the out-diffusion of the dopants in the source/drain extension regions to yield shallower source/drain extension junctions than the just-implanted source/drain extensions.

2. The method of fabricating a MOSFET device according to claim 1, wherein said pre-amorphitization implantation is done with ions comprising $Ge^+$ or $Si^+$.

3. The method of fabricating a MOSFET device according to claim 2, wherein said $Ge^+$ or $Si^+$ ion implant ion energy is approximately between 1 keV and 20 keV and the dose is approximately between 1E14 and 1E16 ions/$cm^2$.

4. The method of fabricating a MOSFET device according to claim 1, wherein said SDE implant is done with $B^+$ ions.

5. The method of fabricating a MOSFET device according to claim 4, wherein said $B^+$ ion implant energy is approximately between 0.2 keV and 0.7 keV and the dose is approximately between 5E14 and 1E16 ions/$cm^2$.

6. The method of fabricating a semiconductor device according to claim 1, wherein said laser anneal is done using a multiple-pulsed 248 nm KrF excimer laser beam.

7. The method of fabricating a semiconductor device according to claim 6, wherein said laser beam has a fluence of approximately between 0.1 J/$cm^2$ and 0.4 J/$cm^2$, pulse duration of approximately between 10 nsec and 40 nsec, and a repetition rate of 1–1000 pulses.

8. The method of fabricating a semiconductor device according to claim 1, wherein said rapid thermal anneal is done at approximately between 800° C. and 1200° C. for a duration of approximately between 0 sec and 60 sec.

9. A method of fabricating a MOSFET device with shallow source/drain extension junctions comprising the steps:
forming a pre-amorphized $Ge^+$ or $Si^+$ implant layer in between shallow trench isolation regions and adjacent to gate electrode structure on a silicon substrate;
performing $B^+$ ion implantation of dopants in said pre-amorphized implant layer to form source/drain extension regions; and
performing a sequential dual step anneal of said source/drain extension regions comprising:
a) a first low energy multiple-pulse laser anneal step in the sub-melt regime to activate the dopants in the source/drain extension regions followed by
b) a second rapid thermal anneal step to heal residual damage from the ion implantation and to cause the out-diffusion of the dopants in the source/drain extension regions to yield shallower source/drain extension junctions than the just-implanted source/drain extensions.

10. The method of fabricating a MOSFET device with shallow source/drain extension junctions according to claim 9, wherein said $Ge^+$ or $Si^+$ ion implant ion energy is approximately between 1 keV and 20 keV and the dose is approximately between 1E14 and 1E16 ions/cm$^2$.

11. The method of fabricating a MOSFET device with shallow source/drain extension junctions according to claim 9, wherein said $B^+$ ion implant energy is approximately between 0.2 keV and 0.7 keV and the dose is approximately between 5E14 and 1E16 ions/cm$^2$.

12. The method of fabricating a MOSFET device with shallow source/drain extension junctions according to claim 9, wherein said low energy laser anneal is done using a multiple-pulsed 248 nm KrF excimer laser.

13. The method of fabricating a MOSFET device with shallow source/drain extension junctions according to claim 12, wherein said multiple-pulsed laser beam has a fluence of approximately between 0.1 J/cm$^2$ and 0.4 J/cm$^2$, pulse duration of approximately between 10 nsec and 40 nsec, and a repetition rate of 1–1000 pulses.

14. The method of fabricating a MOSFET device with shallow source/drain extension junctions according to claim 9, wherein said rapid thermal anneal is done at approximately between 800° C. and 1200° C. for a duration of approximately between 0 sec and 60 sec.

15. A method of forming shallow source/drain extension junctions in a MOSFET device, comprising the steps:
performing $B^+$ ion implantation of dopants in a pre-amorphized implant layer to form source/drain extension regions on a silicon substrate; and
performing a sequential dual step anneal of said source/drain extension regions comprising:
a) a first low energy multiple-pulse laser anneal step in the sub-melt regime to activate the dopants in the source/drain extension regions followed by
b) a second rapid thermal anneal step to heal residual damage from the ion implantation and to cause the out-diffusion of the dopants in the source/drain extension reasons to yield shallower source/drain extension junctions than the just-implanted source/drain extensions.

16. The method of forming shallow source/drain extension junctions in a MOSFET device according to claim 15, wherein said $B^+$ ion implant energy is approximately between 0.2 keV and 0.7 keV and the dose is approximately between 5E14 and 1E16 ions/cm$^2$.

17. The method of forming shallow source/drain extension junctions in a MOSFET device according to claim 15, wherein said low energy laser anneal is done using a multiple-pulsed 248 nm KrF excimer laser.

18. The method of forming shallow source/drain extension junctions in a MOSFET device according to claim 17, wherein said multiple-pulsed laser beam has a fluence of approximately between 0.1 J/cm$^2$ and 0.4 J/cm$^2$, pulse duration of approximately between 10 nsec and 40 nsec, and a repetition rate of 1–1000 pulses.

19. The method of forming shallow source/drain extension junctions in a MOSFET device according to claim 15, wherein said rapid thermal anneal is done at approximately between 800° C. and 1200° C. for a duration of approximately between 0 sec and 60 sec.

20. A method of forming a MOSFET device with shallow source/drain extension junctions, comprising the steps:
forming shallow trench isolation regions on a silicon substrate;
forming the gate stack in between said shallow trench isolation regions;
removing the sidewall spacers from around said gate stack;
forming a pre-amorphized $Ge^+$ or $Si^+$ implant layer in silicon, between shallow trench isolation regions and adjacent to gate electrode structure;
performing $B^+$ ion implantation of dopants in said pre-amorphized implant layer to form source/drain extension regions; and
performing a sequential dual step anneal of said source/drain extension regions comprising:
a) a first low energy multiple-pulse laser anneal step in the sub-melt regime to activate the dopants in the source/drain extension regions followed by
b) a second rapid thermal anneal step to heal residual damage from the ion implantation and to cause the out-diffusion of the dopants in the source/drain extension regions to yield shallower source/drain extension junctions than the just-implanted source/drain extensions.

21. The method of forming a MOSFET device with shallow source/drain extension junctions according to claim 20, wherein said $Ge^+$ or $Si^+$ ion implant ion energy is approximately between 1 keV and 20 keV and dose is approximately between 1E14 and 1E16 ions/cm$^2$.

22. The method of forming a MOSFET device with shallow source/drain extension junctions according to claim 20, wherein said $B^+$ ion implant energy is approximately between 0.2 keV and 0.7 keV and the dose is approximately between 5E14 and 1E16 ions/cm$^2$.

23. The method of forming a MOSFET device with shallow source/drain extension junctions according to claim 20, wherein said multiple-pulsed laser anneal step is done using a 248 nm KrF excimer laser with a fluence of approximately between 0.1 J/cm$^2$, and 0.4 J/cm$^2$, pulse duration of approximately between 10 nsec and 40 nsec, and a repetition rate of 1–1000 pulses.

24. The method of forming a MOSFET device with shallow source/drain extension junctions according to claim 20, wherein said rapid thermal anneal is done at approximately between 800° C. and 1200° C. for a duration of approximately between 0 sec and 60 sec.

* * * * *